(12) United States Patent
Zoller

(10) Patent No.: US 7,358,438 B2
(45) Date of Patent: Apr. 15, 2008

(54) SANDWICH HOUSING FOR AN ANTENNA AMPLIFIER

(75) Inventor: Ortwin Zoller, Altdorf (DE)

(73) Assignee: Hirschmann Electronics GmbH & Co. KG, Neckartenzlingen (DE)

( * ) Notice: Subject to any disclaimer, the term of this patent is extended or adjusted under 35 U.S.C. 154(b) by 0 days.

(21) Appl. No.: 10/928,751

(22) Filed: Aug. 27, 2004

(65) Prior Publication Data

US 2005/0048850 A1 Mar. 3, 2005

(30) Foreign Application Priority Data

Aug. 29, 2003 (DE) ................. 103 40 257
Mar. 6, 2004 (DE) ............... 10 2004 011 032

(51) Int. Cl.
*H02G 3/08* (2006.01)

(52) U.S. Cl. ................. 174/50; 174/520; 174/539; 439/76.2

(58) Field of Classification Search ............ 174/50, 174/52.1, 52.2, 52.4, 17 R, 59, 520, 521, 174/533, 535, 542, 543, 545, 556, 559, 560, 174/561, 562, 563, 539, 377; 220/3.2, 3.3, 220/3.8, 4.02; 439/76.1, 76.2, 949, 535; 361/600, 601, 719, 720, 748, 761

See application file for complete search history.

(56) References Cited

U.S. PATENT DOCUMENTS

| | | | | | |
|---|---|---|---|---|---|
| 4,226,491 | A | * | 10/1980 | Kazama et al. | ............ 439/76.1 |
| 5,373,104 | A | * | 12/1994 | Brauer | ........................ 174/562 |
| 5,392,197 | A | * | 2/1995 | Cuntz et al. | ................. 174/377 |
| 5,545,848 | A | * | 8/1996 | Lin | ............................ 174/52.1 |
| 5,550,712 | A | * | 8/1996 | Crockett | .................... 174/52.1 |
| 6,121,548 | A | * | 9/2000 | Matsuoka | ..................... 174/59 |
| 6,225,559 | B1 | * | 5/2001 | Hubner et al. | ............. 174/52.1 |
| 6,245,992 | B1 | * | 6/2001 | Hou | ............................ 174/50 |
| 6,515,226 | B2 | * | 2/2003 | Chiriku et al. | ................. 174/50 |
| 6,717,051 | B2 | * | 4/2004 | Kobayashi et al. | ......... 174/52.1 |
| 6,816,381 | B2 | * | 11/2004 | Takeuchi | ...................... 174/50 |

FOREIGN PATENT DOCUMENTS

DE   4215041 A1 * 11/1992  .................. 361/720

* cited by examiner

*Primary Examiner*—Angel R. Estrada
(74) *Attorney, Agent, or Firm*—Andrew Wilford

(57) ABSTRACT

An antenna amplifier has its printed circuit board clamped between upper and lower housing parts which have peripheral edges raised to engage the periphery of the circuit board between them. A recess in the housing part can clear a plug connector on the circuit board. Resilient catches can connect the housing parts to apply pressure on the circuit board.

11 Claims, 7 Drawing Sheets

SANDWICH HOUSING FOR AN ANTENNA AMPLIFIER

FIELD OF THE INVENTION

My present invention relates to an electronic device comprising a circuit board and a housing for the circuit board. More particularly, the invention relates to a sandwich housing for an antenna amplifier in which the electronics of the amplifier is provided on a circuit board having at least one plug connector and the housing consists of at least two housing parts.

BACKGROUND OF THE INVENTION

Housings for electronic devices such as antenna amplifiers have heretofore been constructed of at least two housing parts, generally a bottom part and a top part. The bottom part can be a flat plate with a peripheral raised edge while the top part can be a flat cup-shaped member whose peripheral edge extends toward and engages the raised edge of the bottom part to provide a sealed housing within which a circuit board is received. The circuit board generally comprises, in addition to the electrical conductors applied to one or both surfaces thereof, various components required for the antenna amplifier or similar device, plug connectors and the like.

The bottom part of the housing can have pins or the like for positioning the circuit board and generally the peripheral edge of the circuit board lies inwardly of the wall of the housing so that components on the circuit board are spaced from the walls of the housing as well as from the edge of the circuit board.

With this construction, a clearance is required between the board and the walls of the housing and tolerances must be maintained in the fabrication of the board and the housing. Mounting of the board in the housing requires complex and costly systems, tools or appliances and frequently there is difficulty in maintaining planarity of the board, particular board orientations or the like.

OBJECTS OF THE INVENTION

It is the principal object of the present invention to eliminate these drawbacks and provide an improved electronic device including a housing and a circuit board whereby mounting costs can be reduced and the problems associated with board and housing tolerances can be eliminated.

Another object of the invention is to provide an electronic device including a two part housing and a circuit board which is of a simpler construction than heretofore and which enables the device to be assembled without special tools and more rapidly than has heretofore been the case.

It is also an object of the invention to provide an electronic device, especially an antenna amplifier, which can be easily mounted on a wall of an automobile housing and which can facilitate repair or replacement of parts.

SUMMARY OF THE INVENTION

These objects and others which will become apparent hereinafter are attained, in accordance with the invention, in a housing for an electronic device which comprises:
  a first housing part;
  a second housing part;
  fastening elements on at least one of the housing parts enabling the housing parts to be secured together to define a housing interior; and
  a circuit board clamped between at least portions of the housing parts and secured thereby in the housing, the circuit board having circuit elements received in the housing interior.

According to the invention, the circuit board can be an antenna amplifier circuit board which is clamped between the edges of the housing parts forming said portions. The first housing part can be a housing bottom having an upstanding rim while the second housing part can be a housing top with a rim extending toward the housing bottom at least along a portion of the periphery thereof and the circuit board can then be clamped between the rims.

The fastening elements can be detents and catches on the housing parts or the fastening elements can be pins engagable in holes of the board. The plug connector on the board can be received in a recess on at least one of the housing parts and the parts may have aligned holes aligned with a hole in the board to permit a screw or the like to mount the housing with the board on a vehicle body wall.

Because the board is clamped between the housing parts, it is possible to completely eliminate the need for fastening elements to secure the board on one of the housing parts. This also means that the board is fixed in place when the two housing parts are interconnected with one another by being clamped between the two housing parts. The number of mounting and assembly steps is thereby reduced and the need for the application of sealing materials to provide a seal between the housing parts and the periphery of the board clamped thereby is eliminated.

The catches can be resilient to insure that the housing parts will apply pressure from opposite sides to the board. This is especially important where the housing is for an electronic device, for example, an antenna amplifier to be mounted on an automotive vehicle since chattering of the housing parts is thereby eliminated and there is no danger that the housing are generated noise in the vehicle.

BRIEF DESCRIPTION OF THE DRAWING

The above and other objects, features, and advantages will become more readily apparent from the following description, reference being made to the accompanying drawing in which:

FIG. 1A is a detailed view showing film hinge as a possible connection between the upper and lower housing parts;

FIG. 5A is a cross sectional view illustrating how the catches between the upper and lower housing parts engage;

SPECIFIC DESCRIPTION

Figure 7:
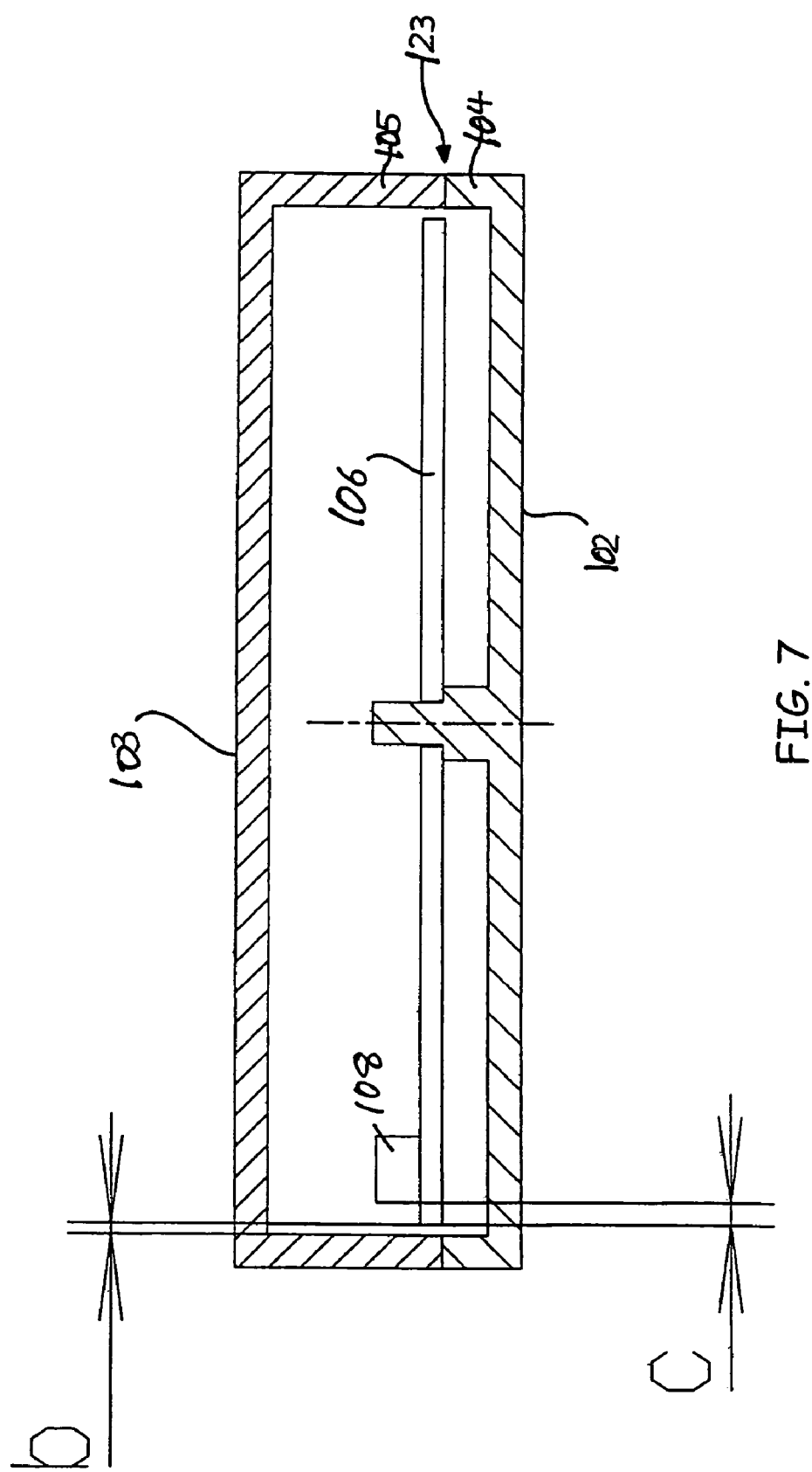
FIG. 7 is a cross sectional view of an electronic device in a housing in accordance with the prior art.

FIG. 7, as has been noted, relates to the prior art and illustrates a housing which comprises a lower part 102 with a peripheral upstanding edge 104 which is aligned with and directly abuts the peripheral edge 105 of the upper housing part 103 so that a joint 123 is provided directly between the upper and lower housing parts. The printed circuit board 106 is here mounted entirely within the housing and thus a component 108 on the printed circuit board must be set inwardly from the housing by the sum of the clearance b between the printed circuit board 106 and the side walls 104, 105 of the housing and the spacing c of that component 108 from the edge of the printed circuit board.

Figure 1:
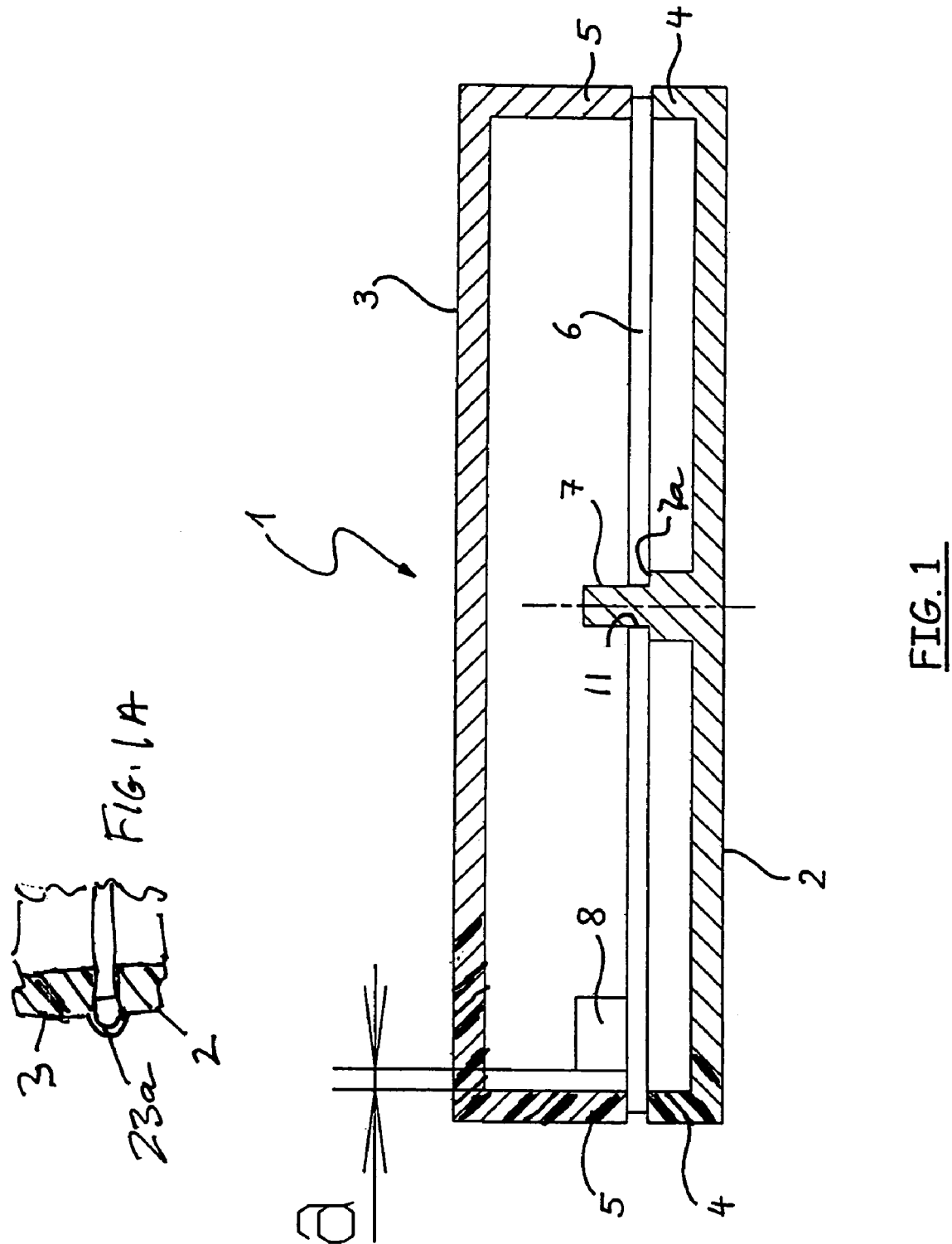
FIG. 1 is a cross sectional view of a housing for an electronic device showing the sandwich construction.

By contrast, as can be seen in FIG. 1, which is a cross section through the electronic device of the invention, for example, an antenna amplifier for an automotive vehicle, the housing 1 is formed by at least one lower part or bottom 2, and at least one upper part or top 3. The two parts 2 and 3 have generally flat configurations and are formed with edges 4 and 5 extending toward one another and extending at least partly around the respective housing part 2 or 3. The heights of the two peripheral edges 4 and 5 depends upon the height of the components on the printed circuit board 6 which is received in the housing, namely, the electronic components, plug connectors and the like, only one of which has been shown at 8 in FIG. 1.

The bottom 2 of the housing (or the top 3) can be provided with a mounting structure, here shown to comprise a pair of pins 7 defining a shoulder 7a upon which the printed circuit board 6 can rest. For this purpose, the printed circuit board can have holes 11 through which the pins 7 can pass. The printed circuit board also may be mounted exclusively between the edges 4 and 5 as seen in FIG. 1 which are clamped against the printed circuit board.

It will be apparent that this arrangement, whereby the edges of the printed circuit board 6 extend between the edges 4 and 5 of the housing, allows the electronic component 8 to be closer to the housing wall (dimension a in FIG. 1) for a given spacing of that component from the edge of the circuit board, then was possible in the prior art. The means for connecting the two housing parts 2 and 3 has not been illustrated in FIG. 1 but has been detailed in FIGS. 2 through 5 or in part in FIG. 1A.

From FIG. 1A, therefore, it will be apparent that the housing parts 2 and 3 can be connected along one side, if desired, by a film hinge 23a.

Figure 2:
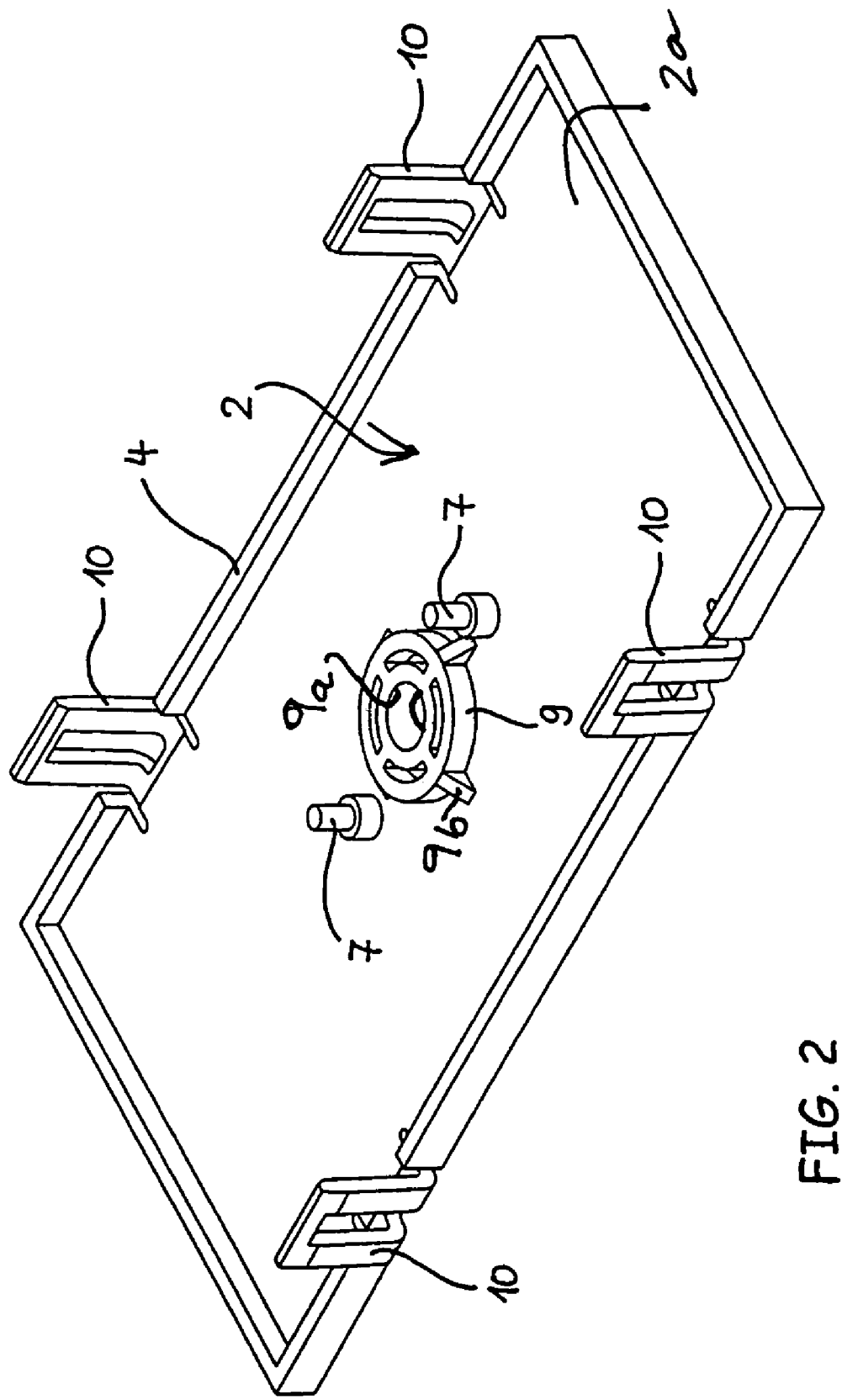
FIG. 2 is a perspective view of the lower portion of the housing, i.e. the portion adapted to lie against a wall of the automotive body before the printed circuit board is applied.

FIG. 2 is a perspective view of the lower part 2 of the housing of FIG. 1 from which the two mounting pins 6 can be seen. The lower housing part 2 has a boss 9 disposed centrally between the pins 7 and which also serves to support the circuit board 6 at a distance from the bottom wall 2a of the housing part 2. The boss 9 can be provided with a center bore 9a through which a fastener can pass to hold the housing against the wall of an automotive body.

In the embodiment illustrated in FIGS. 1 and 2 to 5, the lower part 2 can have, for example, four lugs 10 into which tongues 16 of the upper part 4 can engage (see FIGS. 5 and 5A) to lock the upper part on the lower part. In the region of the lugs 10, the peripheral edge 4 is interrupted. The lower part 2 can be molded as a single piece by injection molding from an appropriate plastic.

Figure 3:
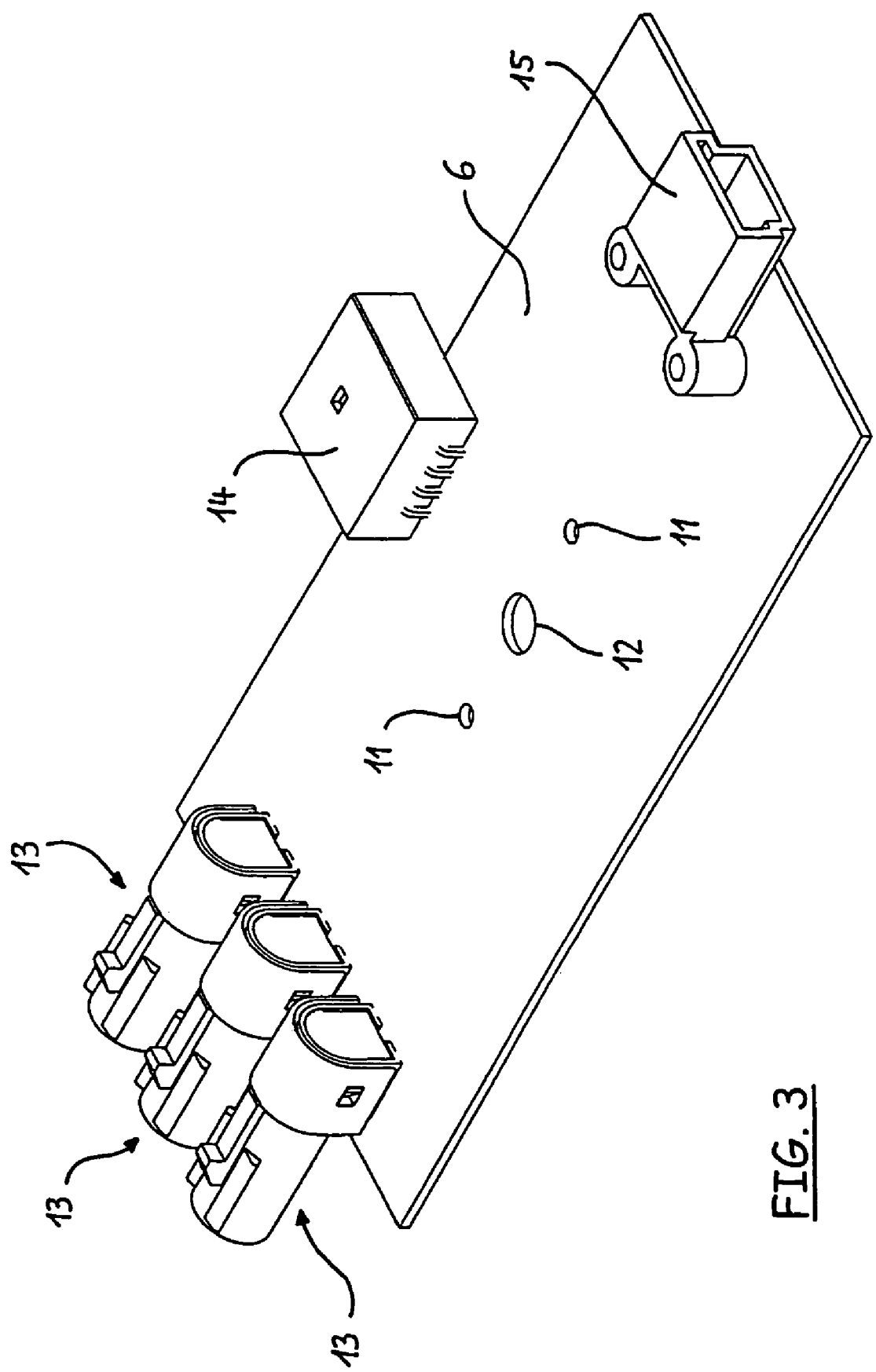
FIG. 3 is a perspective view of the printed circuit board to be mounted on the bottom.

FIG. 3 shows in highly diagrammatic form, a printed circuit board 6 which has openings 11 to receive the pins 7, previously described, and a fastening opening 12 aligned with the hole 9a in the boss 9. Through the fastening opening 12 and the opening 9a, a screw can be inserted to secure the housing to the vehicle body wall. To increase the stability, the boss 9 can be relatively thick and can be provided with stabilizing ribs 9b.

On the printed circuit board 6, plug connectors 13, 14, 15 can be provided as signal by, signal output or current supply connectors. The other electronic components for an antenna amplifier can likewise be mounted on the circuit board along with the appropriate conductors.

Figure 4:
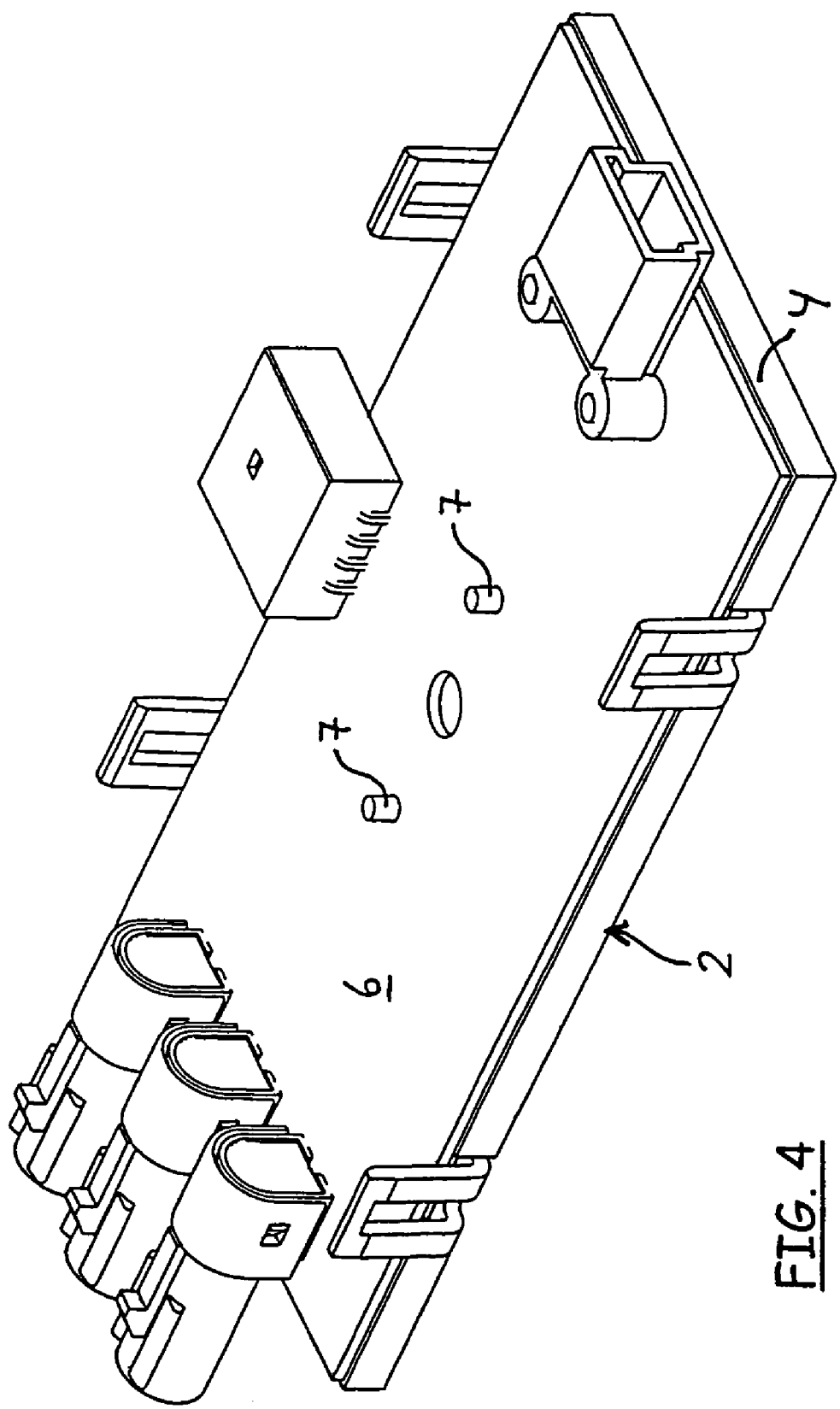
FIG. 4 is a perspective view showing the printed circuit board mounted on the lower housing part.

FIG. 4 shows the printed circuit board 6 mounted upon the lower part 2 of the housing with the pins 7 passing through the openings 11. It will also be apparent that the periphery of the circuit board 6 overlaps the upstanding edge 4 of the housing portion 2. This mounting step can be carried out manually or automatically without specific tooling.

Figure 5:
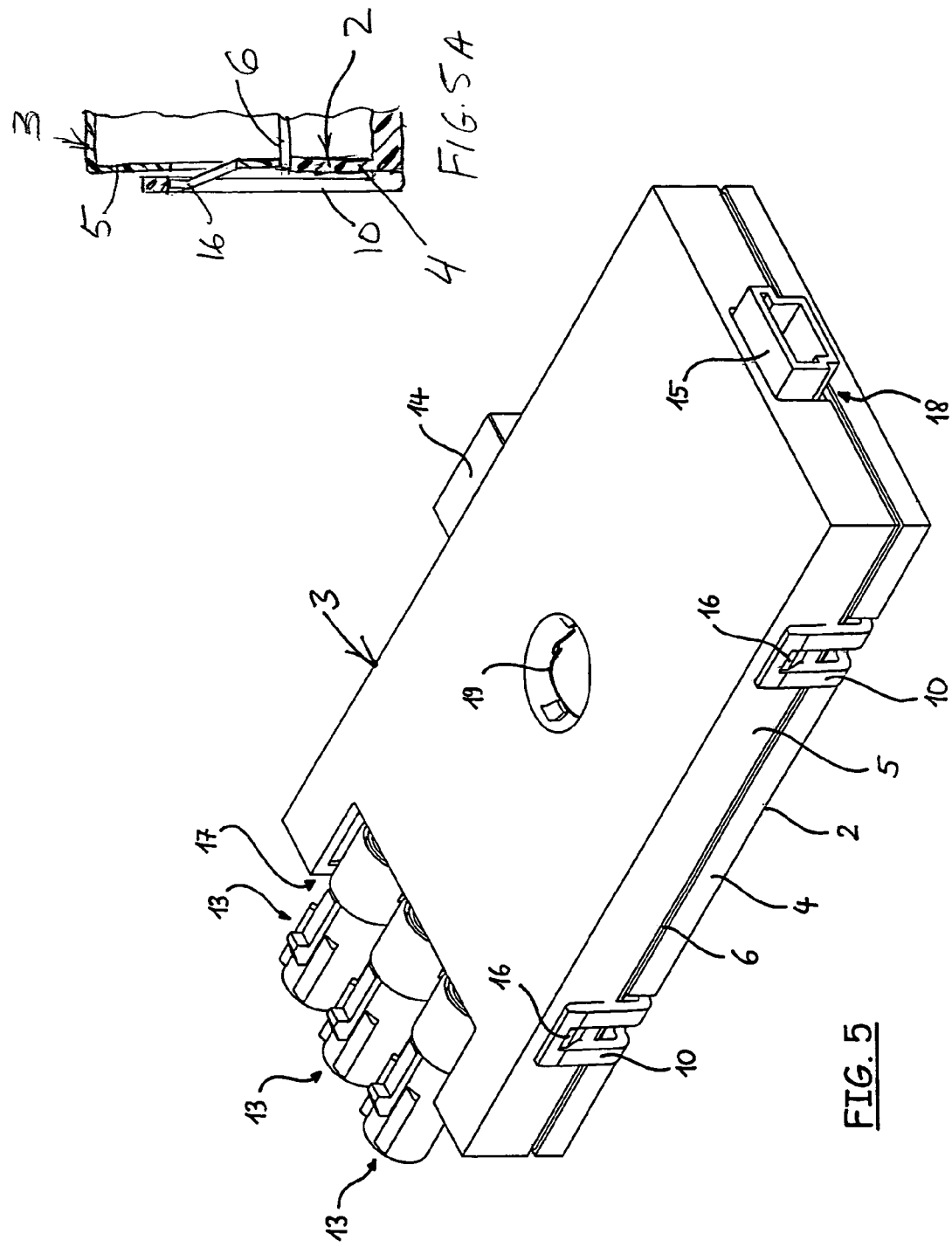
FIG. 5 is a perspective view of the housing following application of the upper housing part.

In FIG. 5 I have shown the upper housing part 3 applied to the assembly of FIG. 4 with the tongue 16 clipped into the lugs 10. For this purpose, the housing portion 3 is simply pressed onto the housing portion 2. The resilience of the tongues 16 and the lugs 10 insures that the housing portion 3 will maintain a pressure against the printed circuit board 6 and the bottom part 2 to avoid chattering and maintain a seal around the clamped periphery of the circuit board 6. The housing part 3 can also be provided with openings 17, 18, etc. to clear the plug connectors 13, 14, 15 and may provide a sufficient clearance or tolerance to permit air circulation within the housing.

The upper housing part 3 is provided with an opening 19 through which the fastening screw or the like can pass to secure the housing to the vehicle body or some other structure.

Figure 6:
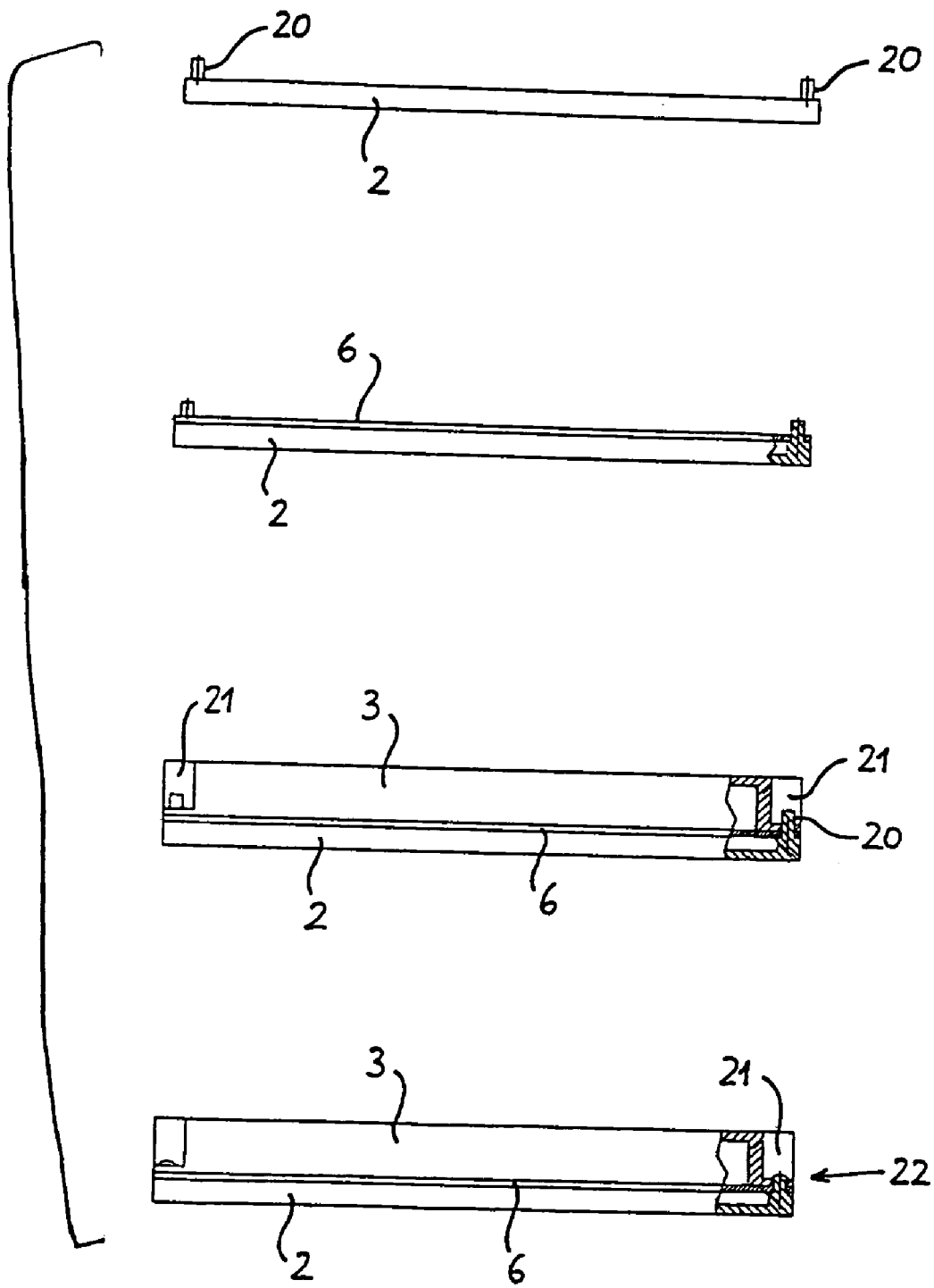
FIG. 6 is a diagram, also partly in section, illustrating the steps in assembly of the housing.

FIG. 6 shows the assembly sequence for a housing of the type described part in an embodiment in which, for example, at all four corners of the lower housing part 2, pins 20 can be provided to engage in holes in the circuit board 6. The circuit board is then placed on the housing part 2 and then the upper part 3 is applied. At the corners of the upper part 3 in FIG. 6, recesses 21 can be provided to clear the pins 20 as they pass through flanges in the upper part. A clamping engagement is provided at 22 as has been described.

The invention permits modification in a number of ways which have not been illustrated.

For example, instead of the mounting pins and shoulders of FIG. 1, the printed circuit board can be secured in its horizontal plane only at its edges or the pins 7 can be coined or riveted over the printed circuit board or the circuit board 6 can be attached to the bottom part 2 of the housing without the need for application of the upper housing part 3.

The printed circuit board 6 also need not be clamped over its entire periphery between the parts 2 and 3 but rather can be secured between them over only a portion of the periphery.

In addition to the peripheral clamping the housing parts 2 and 3 can be provided with ribs or bosses for clamping the circuit board within the walls 4, 5. The housing parts 2 and 3 can be joined together by other techniques, for example, welding, heat bonding, riveting, screws or adhesive bonding. The mounting of the circuit board 6 on the housing part 2 can utilize seats without pins which must pass through holes in the circuit board, thereby permitting the holes to be eliminated.

The invention permits the separate fastening of the circuit board to a housing part to be eliminated, if desired, and permits better utilization of the area of the circuit board. The housing system of the invention has greater stiffness than the prior art structures and is less susceptible to vibration. The system of the invention has fewer critical tolerances and thus can be fabricated less expensively. Long term stability is guaranteed by the large area of contact between the circuit board and the clamping portions of the housing. Finally, the device is readily repairable, especially if no permanent connection of the housing parts is made.

I claim:

1. A housing for an electronic device, the housing comprising:
    a first housing bottom part having an edge and an upstanding rim;
    a second housing top part having an edge and a downwardly extending rim, one of the rims being formed with an opening;
    detents spaced around and projecting past the rim of one of said housing parts;
    respective resilient catches spaced around the rim of the other of the housing part, engaging the detents with prestress, and pressing said housing parts together to define a housing interior; and
    a circuit board having an outer edge engaging the rim of the one housing part, the detents engaging the outer edge, centering, surrounding, and not engaging through the circuit board, the circuit board being clamped between the rims of said housing parts and secured thereby in said housing, said circuit board having circuit elements received in said housing interior and a connector fitting into and exposed at the opening of the one rim.

2. The housing defined in claim 1 wherein said circuit board is an antenna amplifier circuit board.

3. The housing defined in claim 1 wherein the connector is a plug connector on said board.

4. The housing defined in claim 1 wherein the circuit board is secured in said housing exclusively by a connection of said housing parts together.

5. The housing defined in claim 1 wherein said housing parts are interconnected by a hinge.

6. The housing defined in claim 5 wherein said hinge is a film hinge.

7. The housing defined in claim 1 wherein said housing parts are secured together by a coined element, an ultrasonic weld, a threaded element, a rivet, or an adhesive bond.

8. The housing defined in claim 1 wherein one of said housing parts has a pair of pins extending through holes in said board.

9. The housing defined in claim 1 wherein said housing parts have a hole for a screw for mounting said housing on a part of an automobile body.

10. The housing defined in claim 1 wherein the rims interfit and overlap, whereby the entire circuit board except the connector are wholly contained within the housing.

11. The housing defined in claim 1 wherein the detents and catches are unitarily formed with the respective housing parts.

* * * * *